United States Patent
Jiang et al.

(10) Patent No.: US 11,817,830 B2
(45) Date of Patent: Nov. 14, 2023

(54) TWO-STAGE LNA WITH MUTUAL COUPLING

(71) Applicant: pSemi Corporation, San Diego, CA (US)

(72) Inventors: Rong Jiang, San Diego, CA (US); Khushali Shah, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/752,440

(22) Filed: May 24, 2022

(65) Prior Publication Data

US 2022/0360235 A1 Nov. 10, 2022

Related U.S. Application Data

(63) Continuation of application No. 16/928,549, filed on Jul. 14, 2020, now Pat. No. 11,356,068.

(51) Int. Cl.
*H03F 1/22* (2006.01)
*H03F 3/193* (2006.01)
*H03F 1/56* (2006.01)

(52) U.S. Cl.
CPC ............... *H03F 3/193* (2013.01); *H03F 1/56* (2013.01); *H03F 2200/222* (2013.01); *H03F 2200/294* (2013.01); *H03F 2200/372* (2013.01); *H03F 2200/451* (2013.01)

(58) Field of Classification Search
CPC ........................................................ H03F 1/22
USPC ................................................. 330/311, 310
See application file for complete search history.

(56) References Cited

U.S. PATENT DOCUMENTS

| | | | | |
|---|---|---|---|---|
| 9,479,131 | B2* | 10/2016 | Youssef | ............ H03F 3/68 |
| 10,848,111 | B2* | 11/2020 | Arayashiki | ......... H03F 3/45089 |
| 11,205,998 | B2* | 12/2021 | Kong | ............ H03F 1/565 |
| 11,356,068 | B2 | 6/2022 | Jiang et al. | |
| 2004/0066236 | A1 | 4/2004 | Fujimoto | |
| 2022/0021354 | A1 | 1/2022 | Jiang et al. | |

OTHER PUBLICATIONS

Choe, Henry, Notice of Allowance received from the USPTO dated Feb. 11, 2022 for U.S. Appl. No. 16/928,549, 7 pgs.

* cited by examiner

*Primary Examiner* — Henry Choe
(74) *Attorney, Agent, or Firm* — JAQUEZ LAND GREENHAUS & MCFARLAND LLP; John Land, Esq.

(57) ABSTRACT

Compact low noise amplifiers that have wide-band coverage while meeting necessary input matching and output matching characteristics. Embodiments include a wide-band, two-stage LNA with minimum degradation in performance compared to multiple narrow-band, single-stage LNAs. A generalized embodiment includes a first amplifier stage having a terminal coupled to a mutually coupled inductor circuit and to a second amplifier stage. The second amplifier stage includes a terminal coupled to the mutually coupled inductor circuit. The mutually coupled inductor circuit comprises electromagnetically coupled inductors L1, L2. Second terminals of the first and second amplifier stages are coupled to respective degeneration inductors. The electromagnetically coupled inductors L1, L2 of the inductor circuit substantially increase the output bandwidth of the LNA with minimum degradation in performance.

20 Claims, 11 Drawing Sheets

TWO-STAGE LNA WITH MUTUAL COUPLING

CROSS-REFERENCE TO RELATED APPLICATIONS AND CLAIM OF PRIORITY

This application is a continuation of, and claims the benefit of priority under 35 USC § 120 of, commonly assigned and co-pending prior U.S. application Ser. No. 16/928,549, filed Jul. 14, 2020, entitled "Two-Stage LNA with Mutual Coupling", to issue on Jun. 7, 2022 as U.S. Pat. No. 11,356,068, the disclosure of which is incorporated herein by reference in its entirety.

BACKGROUND

(1) Technical Field

This invention relates to electronic circuitry, and more particularly to radio frequency low noise amplifiers.

(2) Background

Many modern electronic systems include radio frequency (RF) receivers; examples include personal computers, tablet computers, wireless network components, televisions, cable system "set top" boxes, radar systems, and cellular telephones. Many RF receivers are paired with RF transmitters in transceivers, which often are quite complex two-way radios. In some cases, RF transceivers are capable of transmitting and receiving across multiple frequencies in multiple bands; for instance, in the United States, the 2.4 GHz band is divided into 14 frequency ranges (channels) spaced about 5 MHz apart. As another example, a modern "smart telephone" may include RF transceiver circuitry capable of concurrently operating on different cellular communications systems (e.g., GSM, CDMA, and LTE), on different wireless network frequencies and protocols (e.g., IEEE 802.11abgn at 2.4 GHz at 2.4 GHz and 5 GHz), and on "personal" area networks (e.g., Bluetooth based systems).

The receiver-side of an RF transceiver includes a "front end" that generally includes at least one low noise amplifier ("LNA"). An LNA is responsible for providing the first stage of amplification for a received RF signal. In many applications, multiple LNAs are needed to cover all frequencies in one or more bands. For example, FIG. 1 is block diagram of a simplified RF receiver having multiple LNAs. An RF signal source 102, such as one or more antennas, provides an RF signal to n LNAs (LNA1-LNAn), each of which provides an amplified RF signal to "downstream" circuits such as down-conversion and baseband circuitry 104_1, 104_n. In the illustrated example, LNA1-LNAn may be individually enabled or disabled by a corresponding control signal, ENABLE1-ENABLEn. Additional components not shown in FIG. 1 may include, for example (1) RF switches, filters, and impedance matching circuitry before LNA1-LNAn, and (2) attenuators, filters, and impedance matching circuitry after LNA1-LNAn.

The operational characteristics of an LNA are very important to the overall quality of an RF receiver, particularly low noise, gain flatness (i.e., signal gain variation across frequency), linearity, input matching, and output matching. However, it is known that low noise, gain flatness, linearity, input matching, and output matching are hard to achieve over a wide band. Accordingly, multiple narrow-band, single-stage LNAs are generally used to cover all frequency bands required of an RF transceiver. Typically, each LNA requires dedicated analog circuitry, such as inductors, capacitors, bias voltage generators, signal level shifters, matching networks, etc.

Modern RF receivers, whether stand-alone or as part of a transceiver, are generally embodied in an integrated circuit (IC) die. As in many areas of modern electronics, a smaller die size is a key goal for cost reduction of RF products. However, RF receivers that include multiple narrow-band, single-stage LNAs consume a significant die area for all of the necessary dedicated analog circuitry. In addition, LNAs are generally spaced apart and oriented with respect to each other in order to avoid or minimize cross-coupling of signals, particularly electromagnetic energy in inductive elements. Such spacing and orientation further consumes a significant die area.

Accordingly, there is a need for compact LNA circuitry that overcomes the limitations of the prior art. Embodiments of the present invention provide such circuitry, as well as additional benefits.

SUMMARY

The present invention encompasses embodiments of compact low noise amplifiers that have wide-band coverage while meeting necessary input matching and output matching characteristics. Embodiments include a mutually coupled inductor circuit-based, wide-band, two-stage LNA with minimum degradation in performance compared to multiple narrow-band, single-stage LNAs.

A generalized mutually coupled inductor circuit-based, wide-band, two-stage LNA in accordance with the present invention is configured to receive an RF signal, $RF_{IN}$, typically coupled through a matching network to the input of a first amplifier stage. The input of the first amplifier stage may be, for example, the gate of a suitably biased field effect transistor (FET). A first terminal of the first amplifier stage is coupled to a mutually coupled inductor circuit at a node X1. The first terminal may be, for example, the drain of a FET (which need not be the input FET for the first amplifier stage). A second terminal of the first amplifier stage is coupled to a first degeneration inductor. The second terminal may be, for example, the source of a FET (which may be the source of the input FET for the first amplifier stage). The first degeneration inductor in turn is coupled to an RF circuit ground. The first degeneration inductor is not intentionally electromagnetically coupled to other inductors.

The node X1 provides an amplified output signal from the first amplifier stage and is coupled through a capacitor (which may be tunable) to the input of a second amplifier stage. The input of the second amplifier stage may be, for example, the gate of a suitably biased FET. A first terminal of the second amplifier stage is coupled to the mutually coupled inductor circuit at a node X2. The first terminal may be, for example, the drain of a FET (which need not be the input FET for the second amplifier stage). A second terminal of the second amplifier stage is coupled to a second degeneration inductor. The second terminal may be, for example, the source of a FET (which may be the source of the input FET for the second amplifier stage). The second degeneration inductor in turn is coupled to an RF circuit ground. The second degeneration inductor is not intentionally electromagnetically coupled to other inductors. A capacitor (which may be tunable) coupled to the node X2 provides a further amplified output signal, $RF_{OUT}$, from the second amplifier stage.

In some embodiments, the first amplifier stage may include at least two series-connected FETs in a cascode arrangement, with a "top" FET having its drain coupled to the node X1, and a "bottom" input FET having its source coupled to the first degeneration inductor and its gate coupled to the matching network. In some embodiments, the second amplifier stage may include an input FET having its gate coupled to the capacitor between the amplifier stages, its source coupled to the second degeneration inductor, and its drain coupled to the node X2, or to one or more additional series-coupled FETs (e.g., in a cascode arrangement).

The mutually coupled inductor circuit comprises at least a pair of electromagnetically coupled inductors L1, L2. A mutual coupling factor K exists between the inductors L1, L2 of the inductor circuit. Operationally, the electromagnetically coupled inductors L1, L2 of the inductor circuit substantially increase the output bandwidth of the LNA with minimum degradation in performance compared to multiple narrow-band, single-stage LNAs. In essence, the electromagnetically coupled inductors L1, L2 of the inductor circuit provide a shared amount of added effective inductance to each of the first amplifier stage and the second amplifier stage without increasing the physical size of the inductors L1, L2 actually connected to a respective stage. The added effective inductance results in a wider output bandwidth for the LNA. In some embodiments, the added inductance may be a negative value. The electromagnetic coupling also provides a feedback path from the output of the second amplifier stage, which may increase the bandwidth of the LNA. The two inductors L1, L2 may also allow the LNA to achieve a wider bandwidth by each matching a different band of interest.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses embodiments of compact low noise amplifiers (LNAs) that have wide-band coverage while meeting necessary input matching and output matching characteristics. Embodiments include a mutually coupled inductor circuit-based, wide-band, two-stage LNA having minimum degradation in performance compared to multiple narrow-band, single-stage LNAs.

General Embodiment

Figure 1:
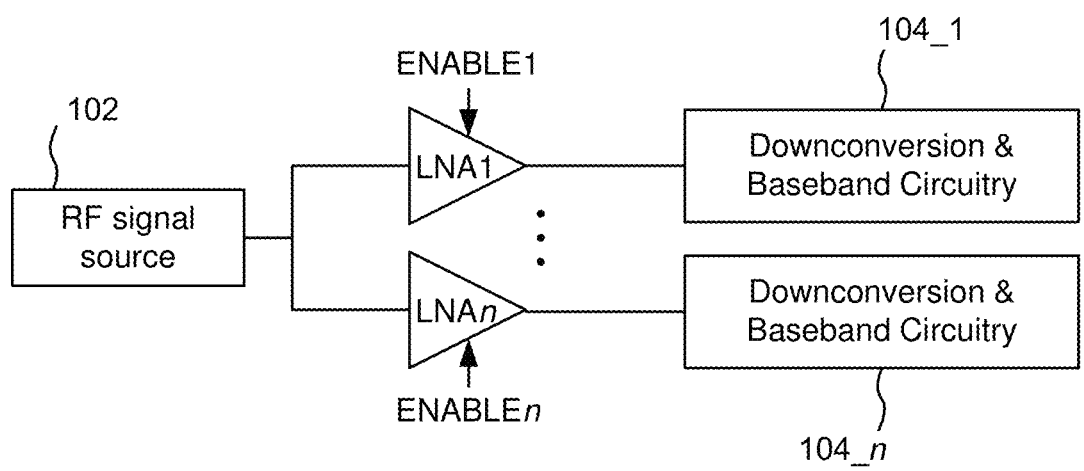
FIG. 1 is block diagram of a simplified RF receiver having multiple LNAs.
Figure 2:
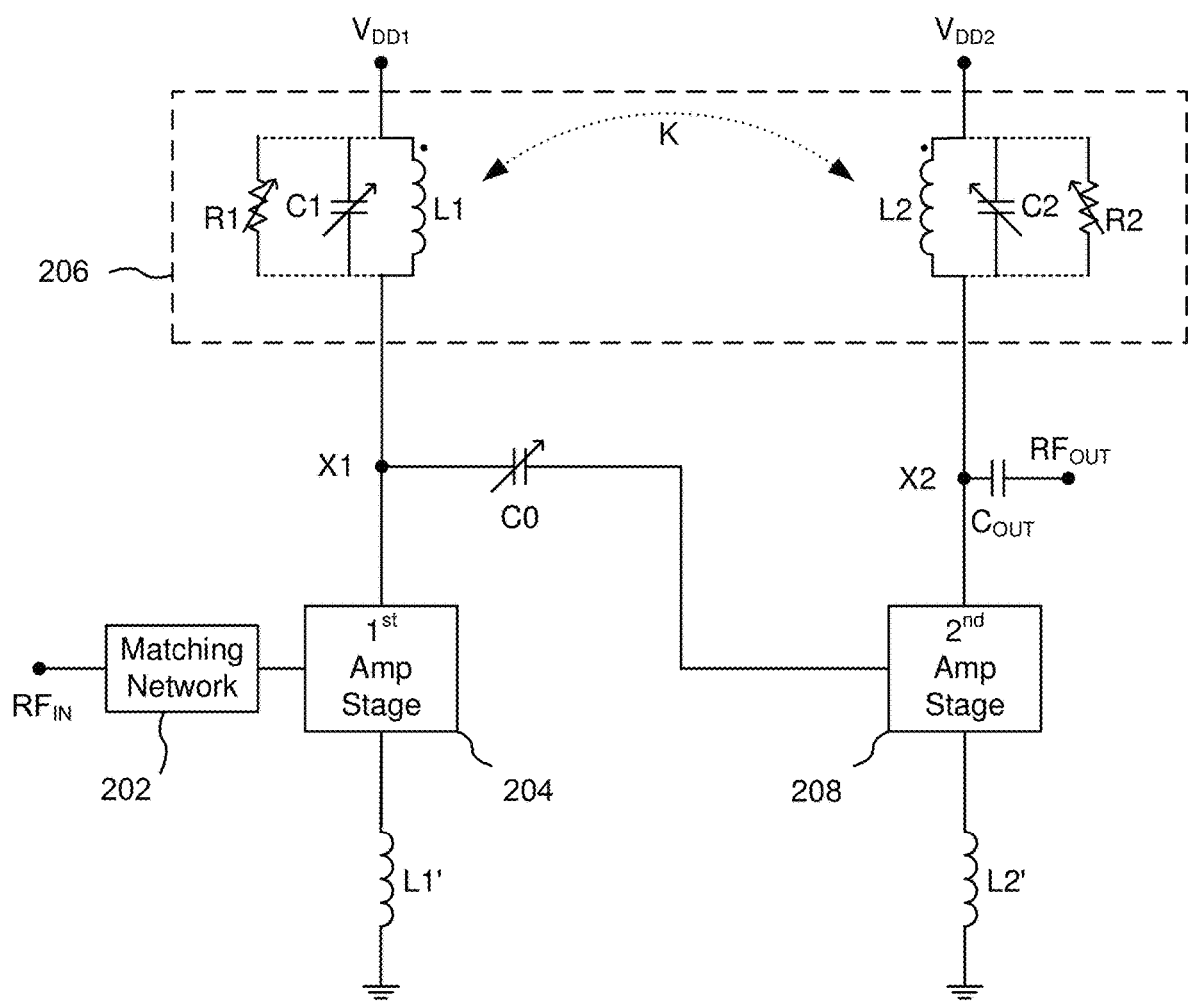
FIG. 2 is a block diagram of a generalized mutually coupled inductor circuit-based, wide-band, two-stage LNA in accordance with the present invention.

FIG. 2 is a block diagram of a generalized mutually coupled inductor circuit-based, wide-band, two-stage LNA 200 in accordance with the present invention. The LNA 200 is configured to receive an RF signal, $RF_{IN}$, typically coupled through a matching network 202 to the input of a first amplifier stage 204. The input of the first amplifier stage 204 may be, for example, the gate of a suitably biased field effect transistor (FET). The matching network 202 may be, for example, an inductor series-coupled to a capacitor, with the inductor configured to receive the RF signal, $RF_{IN}$. A first terminal of the first amplifier stage 204 provides an amplified output signal that is coupled to a mutually coupled inductor circuit 206 at a node X1 and to a capacitor C0. The capacitor C0 couples the output of the first amplifier stage 204 to the input of a second amplifier stage 208, and may be fixed, adjustable, or tunable (such as a digitally tunable capacitor, or DTC). For an example of a DTC, see U.S. Pat. No. 6,667,506 issued on Dec. 23, 2003, entitled "*Variable Capacitor with Programmability*", assigned to the assignee of the present invention and hereby incorporated by reference. The first terminal of the first amplifier stage 204 may be, for example, the drain of a FET (which need not be the input FET for the first amplifier stage 204).

A second terminal of the first amplifier stage 204 is coupled to a first degeneration inductor L1', which primarily enables input matching in conjunction with the matching network 202. The second terminal may be, for example, the source of a FET (which may be the source of the input FET for the first amplifier stage 204). The first degeneration inductor L1' in turn is coupled to an RF circuit ground. (Note that "RF ground" in the context of this disclosure refers to a ground connection suitable for RF circuitry, rather than to "digital" ground typically used for DC and/or low frequency digital circuits and/or as an electro-static discharge return path.) The first degeneration inductor L1' may be tunable, such as by having multiple taps which allow selection of different conductive coil lengths, and thus different inductance values. Note that the first degeneration inductor L1' is not intentionally electromagnetically coupled to the other inductors shown in FIG. 2.

The input of the second amplifier stage 208 may be, for example, the gate of a suitably biased FET. A first terminal of the second amplifier stage 208 is coupled to the mutually coupled inductor circuit 206 at a node X2. The first terminal may be, for example, the drain of a FET (which need not be the input FET for the second amplifier stage 208). A second terminal of the second amplifier stage 208 is coupled to a second degeneration inductor L2', which primarily enables gain tuning plus inter-stage matching to achieve a wider bandwidth. The second terminal may be, for example, the source of a FET (which may be the source of the input FET for the second amplifier stage 208). The second degeneration inductor L2' in turn is coupled to an RF circuit ground. The second degeneration inductor L2' may be tunable, such as by having multiple taps which allow selection of different conductive coil lengths, and thus different inductance values. Note that the second degeneration inductor L2' is not intentionally electromagnetically coupled to the other inductors shown in FIG. 2.

An output capacitor $C_{OUT}$ coupled to the node X2 provides a further amplified output signal, $RF_{OUT}$, from the second amplifier stage 208. The output capacitor $C_{OUT}$ may be fixed, adjustable, or tunable (such as a DTC), and may be coupled to a matching network (not shown).

In some embodiments, the first amplifier stage 204 may include at least two series-connected FETs, with a first input FET having its source coupled to the first degeneration inductor L1' and its gate coupled to the matching network 202, and an output FET having its drain coupled to the node X1 and its source coupled to the drain of the input FET. Examples of the first amplifier stage 204 are further described below. In some embodiments, the second amplifier stage 208 may include an input FET having its gate coupled to the capacitor C0, its source coupled to the second degeneration inductor L2', and its drain coupled to the node X2, or to one or more additional series-coupled output FETs. Examples of the second amplifier stage 208 are further described below. In some applications, to withstand higher voltages and produce higher output power, it may be useful to "stack" two or more FETs and couple their gates in common, thus making the stack behave like a single FET. Accordingly, in the figures of this disclosure, a symbol depicting a single FET may be implemented in an IC as a stack of common-gate FETs without departing from the teachings of the invention.

Not shown are optional capacitances, resistances, and/or inductances that may be added to the circuit for additional tuning or adjustment purposes. Also not shown are parasitic capacitances and/or resistances and/or inductances.

Mutually Coupled Inductor Circuit Details

In the illustrated embodiment, the mutually coupled inductor circuit 206 is coupled to the nodes X1 and X2. The mutually coupled inductor circuit 206 comprises a pair of electromagnetically coupled inductors L1, L2 coupled to nodes X1 and X2, respectively. Each inductor L1, L2 is also configured to be coupled to a corresponding supply voltage $V_{DD1}$, $V_{DD2}$, which may be a common source (i.e., the voltages for $V_{DD1}$ and $V_{DD2}$ may be different in some embodiments, but may be the same in other embodiments).

A mutual coupling factor K exists between the inductors L1, L2 of the mutually coupled inductor circuit 206, and the small circle symbol next to each inductor L1, L2 represents the corresponding polarity of the inductors. In the illustrated embodiment, the polarity of the inductors L1, L2 is the same. However, in other embodiments, the polarity of the inductors L1, L2 may be opposite (e.g., if the second amplifier stage 208 is in a common gate topology).

The inductors L1, L2 may be formed as adjacent conductive coils on the same layer of an IC, or adjacent and overlapping (e.g., stacked) in different layers of an IC. In order to achieve satisfactory mutual electromagnetic coupling, the coils comprising the inductors L1, L2 should be spaced relatively close together on an IC. In contrast, in conventional designs using multiple narrow-band, single-stage LNAs, the respective inductors for those LNAs are generally spaced relatively far apart in order to minimize electromagnetic coupling. One or both of the inductors L1, L2 may be tunable, such as by having multiple taps which allow selection of different conductive coil lengths, and thus different inductance values.

In some embodiments, one or both of the inductors L1, L2 optionally may be paired with a corresponding parallel selectable-value capacitor C1, C2 for tuning. The selectable-value capacitors C1, C2 may be, for example, a single capacitor that may be switched into or out of circuit by a respective series-coupled switch (not shown), or may be more flexible, such as a DTC.

In some embodiments, one or both of the inductors L1, L2 optionally may be paired with a corresponding parallel selectable-value resistor R1, R2 for gain tuning. The selectable-value R1, R2 may be, for example, a single resistor that may be switched into or out of circuit by a respective series-coupled switch (not shown), or may be more flexible, such as an adjustable or variable resistor.

Not shown are optional capacitances, resistances, and/or inductances that may be added to the mutually coupled inductor circuit 206 for additional tuning or adjustment purposes. Also not shown are parasitic capacitances (e.g., between the coupled inductors L1, L2 and a ground plane) and/or resistances and/or inductances.

Operationally, the electromagnetically coupled inductors L1, L2 of the common source configured inductor circuit 206 substantially increase the output bandwidth of the LNA 200 with minimum degradation in performance compared to multiple narrow-band, single-stage LNAs. In essence, the electromagnetically coupled inductors L1, L2 of the inductor circuit 206, having a positive mutual coupling factor K, provide a shared amount of added effective negative inductance to each of the first amplifier stage 204 and the second amplifier stage 208 without increasing the physical size of the inductor L1, L2 actually connected to a respective stage 204, 208. The added effective negative inductance results in a wider output bandwidth for the LNA. The electromagnetic coupling also provides a feedback path from the output of the second amplifier stage 208, which may increase the bandwidth of the LNA 200. The two inductors L1, L2 may also allow the LNA to achieve a wider bandwidth by each matching a different band of interest. In some embodiments, the added inductance may be a positive value by configuring the electromagnetically coupled inductors L1, L2 to have a negative mutual coupling factor K for a common source configured inductor circuit 206. Note that if the input stage of the second amplifier stage 208 is in a common gate configuration, a negative mutual coupling factor K is generally required to generate a negative inductance and increase bandwidth, while a positive mutual coupling factor K is generally required to generate a positive inductance and decrease bandwidth.

Figure 3:
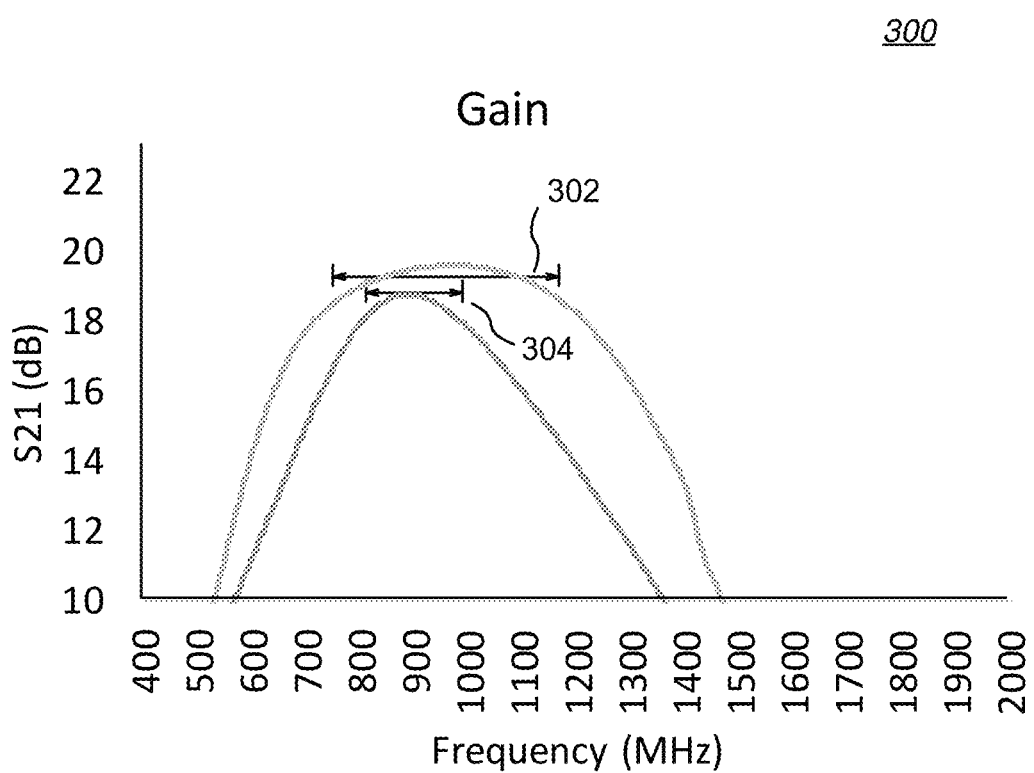
FIG. 3 is a graph of the S21 parameters as a function of frequency for a modeled mutually coupled inductor circuit-based, wide-band, two-stage LNA having the general architecture of the LNA of FIG. 2 compared to a modeled prior art narrow-band, single-stage LNA.

For example, FIG. 3 is a graph 300 of the S21 parameters as a function of frequency for a modeled mutually coupled inductor circuit-based, wide-band, two-stage LNA having the general architecture of the LNA 200 of FIG. 2 (graph line 302) compared to a modeled prior art narrow-band, single-stage LNA (graph line 304). As is evident from the graph 300, two or more narrow-band, single-stage LNAs, each tuned to a different center frequency, would be needed to cover the same bandwidth as the mutually coupled inductor circuit-based, wide-band, two-stage LNA. The broader bandwidth of the mutually coupled inductor circuit-based, wide-band, two-stage LNA allows a single LNA to cover a designated band. For example, a single LNA in accordance with the present invention may be used to amplify RF signals in low band (500 MHz to 1 GHz), or high band (2 GHz to 4 GHz), or ultra-high band (6 GHz to 9 GHz) products.

A single mutually coupled inductor circuit-based, wide-band, two-stage LNA allows a smaller IC die in comparison to the prior art for at least two reasons: (1) a single LNA requires only one set of dedicated analog circuitry, such as bias voltage generators, signal level shifters, matching networks, etc., and (2) because electromagnetic coupling of the L1 and L2 inductors in the inductor circuit 206 is desired (as opposed to something the prior art avoids), the L1 and L2 inductors can be fabricated in closer proximity on an IC die.

Figure 4:
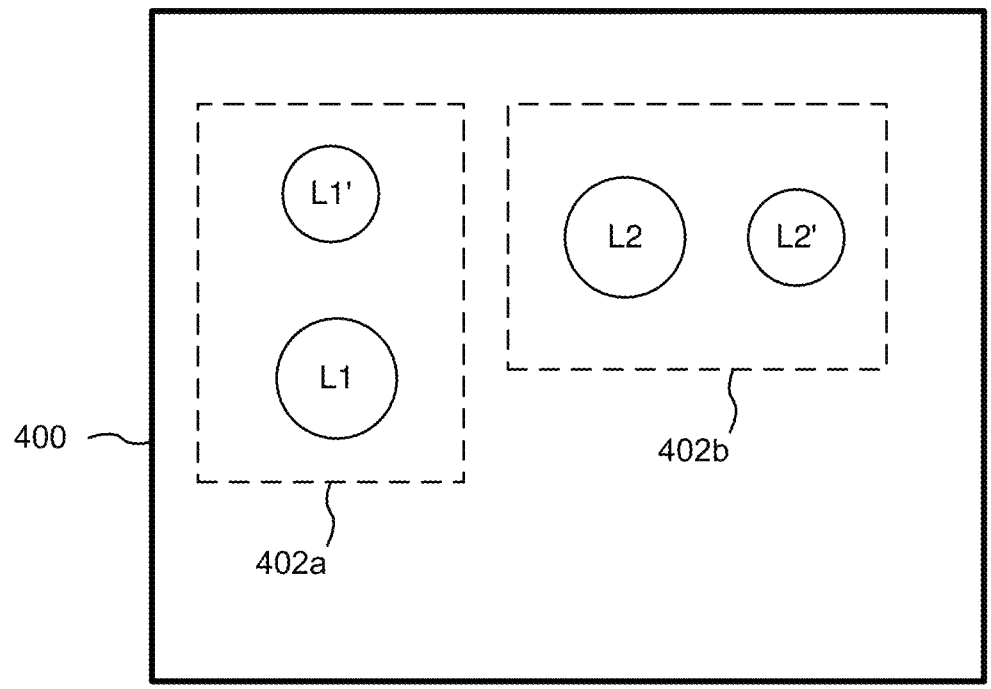
FIG. 4 is a stylized top plan view of an IC showing a typical layout of two narrow-band, single-stage LNAs each having respective inductors L1, L1' and L2, L2' that are not electromagnetic coupled.
Figure 5:
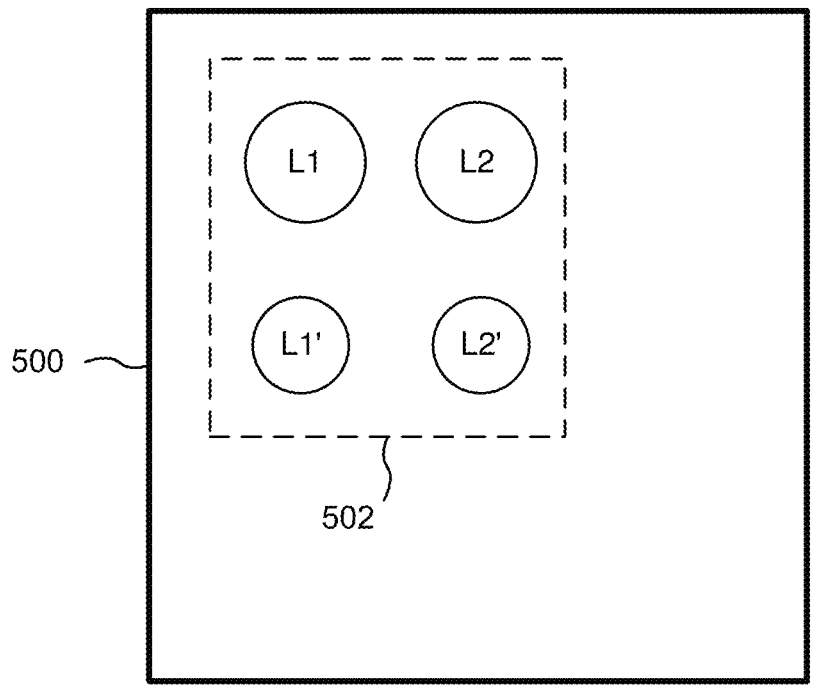
FIG. 5 is a stylized top plan view of an IC showing a possible layout of a mutually coupled inductor circuit-based, wide-band, two-stage LNA having inductors L1, L1' and L2, L2', with the inductors L1, L2 in an electromagnetic coupled configuration.

For example, FIG. 4 is a stylized top plan view of an IC 400 showing a typical layout of two narrow-band, single-stage LNAs 402a, 402b each having respective inductors L1, L1' and L2, L2' that are not electromagnetic coupled. In contrast, FIG. 5 is a stylized top plan view of an IC 500 showing a possible layout of a mutually coupled inductor circuit-based, wide-band, two-stage LNA having inductors L1, L1' and L2, L2', with the inductors L1, L2 in an electromagnetic coupled configuration. As can be seen, the area of the IC 400 required for the two LNAs 402a, 402b of FIG. 4 is greater than the area of the IC 500 required for the single LNA 502 of FIG. 5, and accordingly the IC 500 can be made smaller (and thus less expensively) than the IC 400. Further, if the inductors L1, L2 are combined into a single IC transformer, the IC size can be further reduced.

Example LNA Embodiments

Figure 6:
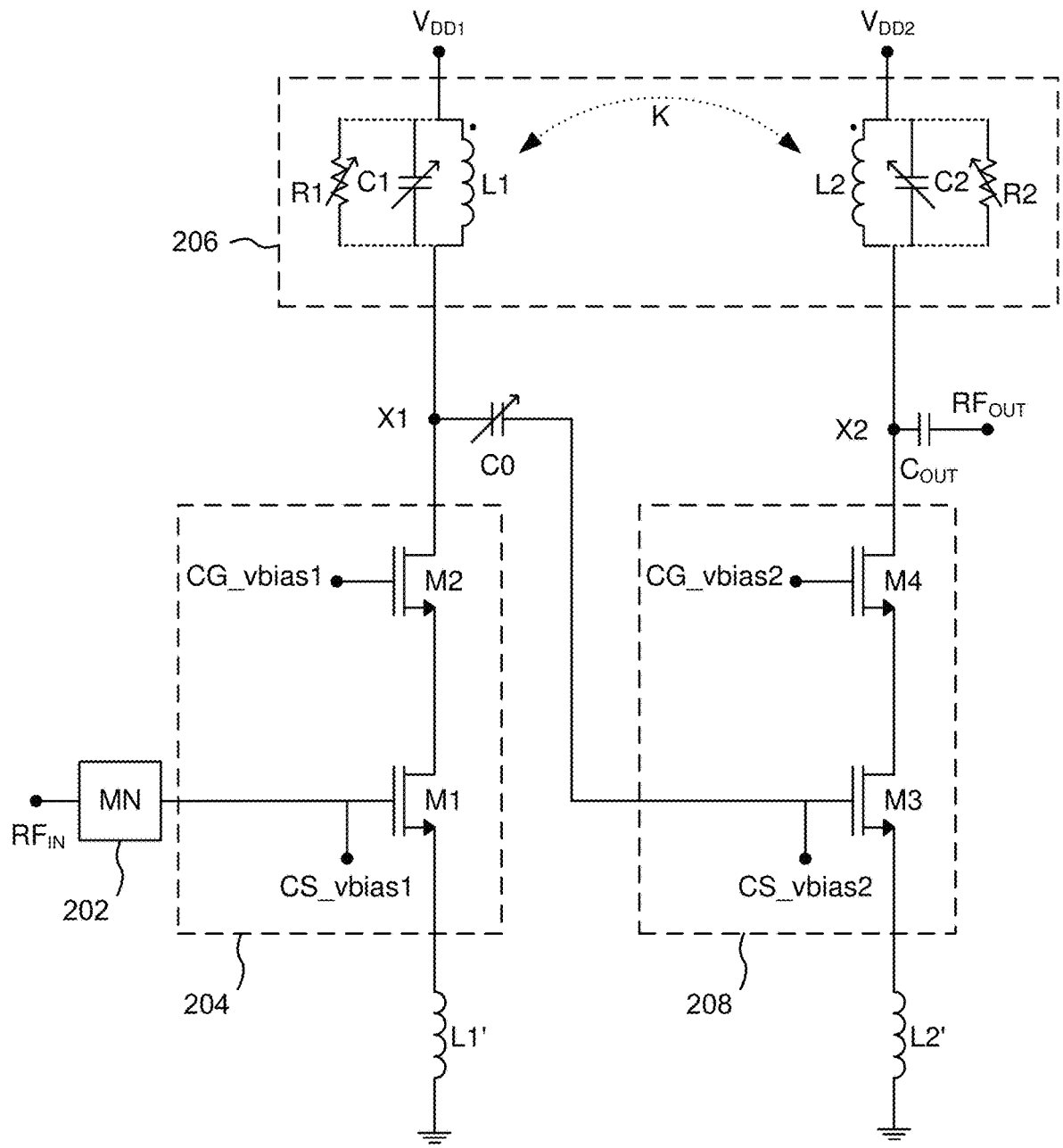
FIG. 6 is a schematic diagram of a first embodiment of a mutually coupled inductor circuit-based, wide-band, two-stage LNA.

As noted above, the first amplifier stage 204 and the second amplifier stage 208 of FIG. 2 may have various configurations in different embodiments. For example, FIG. 6 is a schematic diagram of a first embodiment of a mutually coupled inductor circuit-based, wide-band, two-stage LNA 600. Coupled to the node X1 and the node X2 is an instance of the inductor circuit 206 described above. The illustrated example has a single RF input $RF_{IN}$ to the gate of a first FET M1 through a matching network 202 (for example, an inductor series coupled to a capacitor). The first FET M1 is coupled between a second FET M2 and the first degeneration inductor L1' and is biased by a voltage CS_vbias1. The second FET M2 is coupled to the node X1 and is biased by a voltage CG_vbias1. Together, the first FET M1 and the second FET M2 form a cascode amplifier and correspond to an instance of the first amplifier stage 204 of FIG. 2.

The output of the first amplifier stage 204 at the node X1 is coupled through the capacitor C0 to the gate of a third FET M3, which is coupled between a fourth FET M4 and the second degeneration inductor L2', and is biased by a voltage CS_vbia2. The fourth FET M4 is coupled to the node X2 and is biased by a voltage CG_vbias2. Together, the third FET M3 and the fourth FET M4 form a cascode amplifier and correspond to an instance of the second amplifier stage 208 of FIG. 2. The output of the second amplifier stage 208 at the node X2 is coupled through the output capacitor $C_{OUT}$ as $RF_{OUT}$.

Thus, the specific configuration of the first amplifier stage 204 and the second amplifier stage 208 shown in FIG. 6 is a two-stage cascode architecture that, compared to a single amplifier stage, provides higher input-output isolation (since there is no direct coupling from the input to the output in either cascode amplifier stage), potentially high output impedance, and higher bandwidth. Due to the mutually coupled inductor circuit 206, the LNA 600 provides gain flatness, output matching, and wide bandwidth in a smaller IC "footprint".

Figure 7:
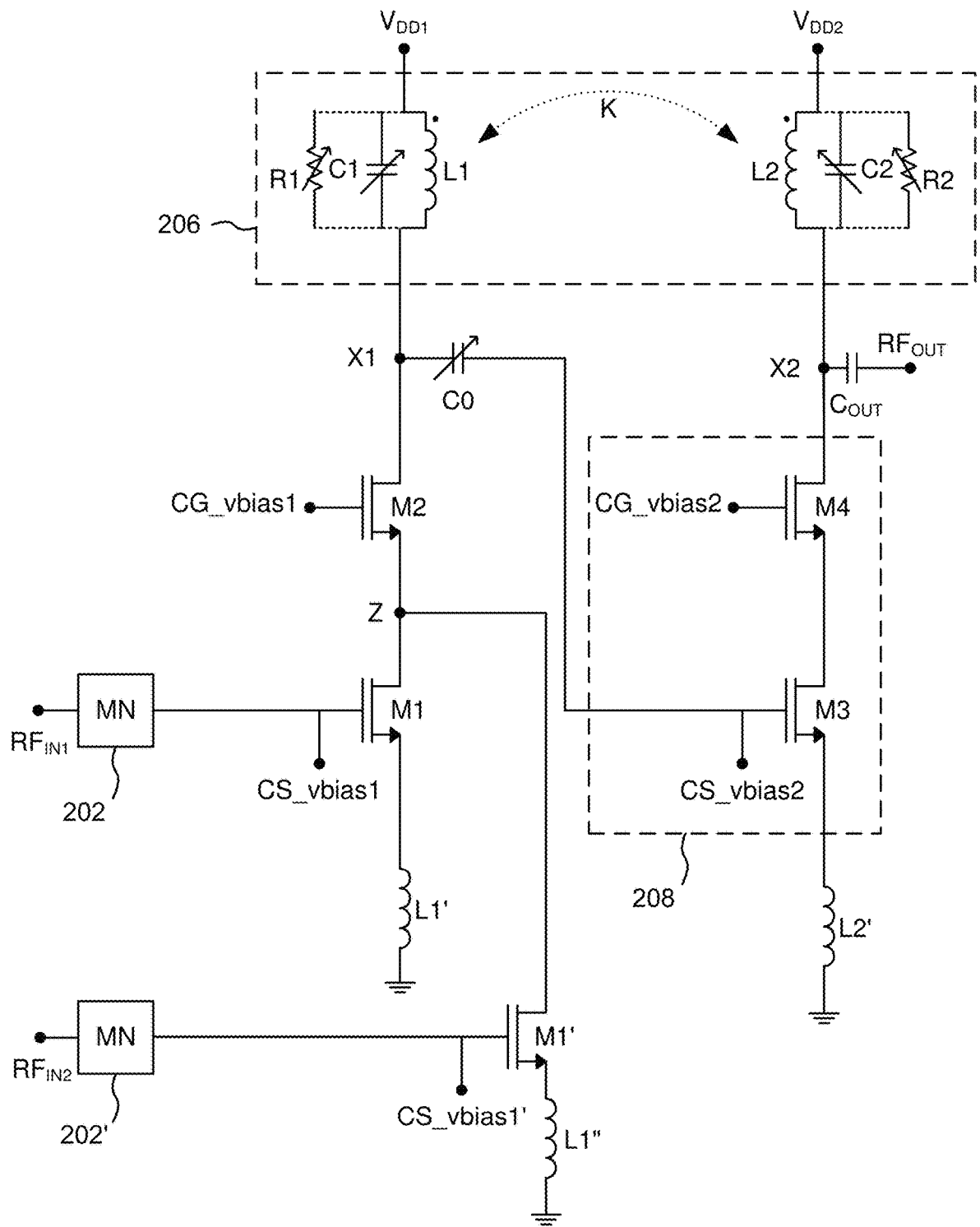
FIG. 7 is a schematic diagram of a second embodiment of a mutually coupled inductor circuit-based, wide-band, two-stage LNA.

As another example of an amplifier stage configuration, FIG. 7 is a schematic diagram of a second embodiment of a mutually coupled inductor circuit-based, wide-band, two-stage LNA 700. The illustrated LNA 700 is very similar to the LNA 600 of FIG. 6, but provides for at least a second RF input. As illustrated, the input to the first amplifier stage 204 is $RF_{IN1}$. A second RF input $RF_{IN2}$ may be coupled to the gate of an additional input FET M1' through an associated matching network 202'. The additional input FET M1' is biased by a voltage CS_vbias1' and is coupled between an associated degeneration inductor L1" and a node Z to which the drain of the first input FET M1 is coupled. Additional RF input FETs (with associated matching network, bias voltage, and degeneration inductor) may be coupled in parallel with the first input FET M1 in a similar manner.

The multiple input LNA 700 of FIG. 7 may be useful, for example, for selectively accepting RF inputs $RF_{INx}$ tuned to different frequencies. For example, in one embodiment, $RF_{IN1}$ may be from a source tuned to 800 MHz, while $RF_{IN2}$ may be from a source tuned to 900 MHz. Selection between the RF inputs may be by means of an RF switch (not shown). In other embodiments, RF signals may be concurrently applied to two or more of the inputs $RF_{INx}$, which may improve the noise figure of the LNA 700 (see further discussion of noise figure below).

Figure 8:
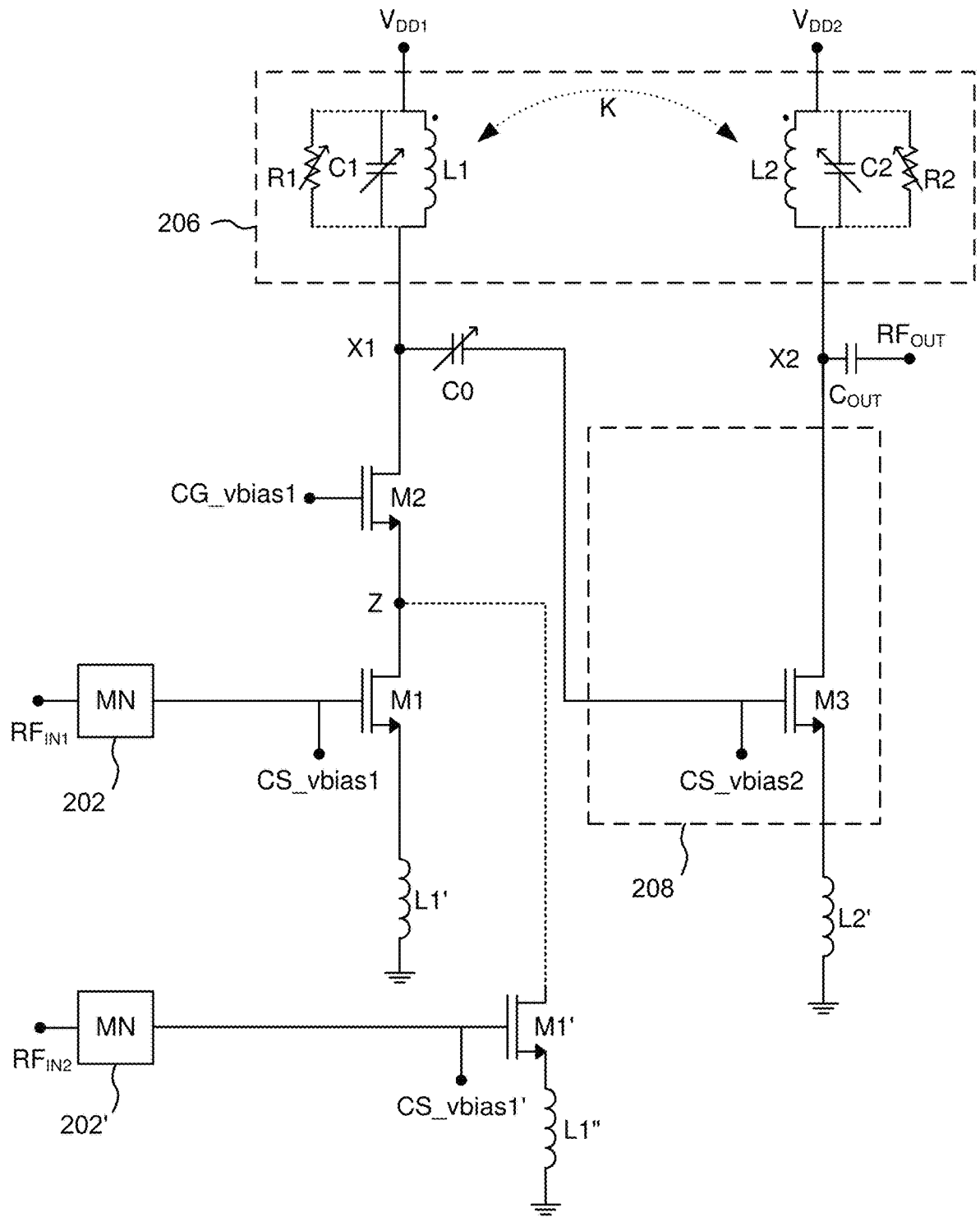
FIG. 8 is a schematic diagram of a third embodiment of a mutually coupled inductor circuit-based, wide-band, two-stage LNA.

As yet another example of an amplifier stage configuration, FIG. 8 is a schematic diagram of a third embodiment of a mutually coupled inductor circuit-based, wide-band, two-stage LNA 800. The illustrated LNA 800 is very similar to the LNA 700 of FIG. 7, but a second RF input circuit is optional (shown connected to node Z by a dotted line in FIG. 8). Further, in applications in which the gain from the first amplifier stage (i.e., at least FETs M1 and M2 in the illustrated example) is adequate and the output impedance of the LNA 800 is sufficient or the linearity needs to be optimized, the second amplifier stage 208 of FIG. 7 may be simplified. For example, the second amplifier stage 208 of FIG. 8 omits the fourth FET M4 of FIG. 7, and instead the drain of the third FET M3 is coupled to the node X2. Accordingly, the first FET M1 and the third FET M3 are in a common source configuration.

As with the multiple input LNA 700 of FIG. 7, the LNA 800 of FIG. 8, when in a multiple input configuration, may be used with selected RF inputs $RF_{INx}$ tuned to different frequencies, or may have RF signals concurrently applied to two or more of the inputs $RF_{INx}$.

Performance

Simulations of embodiments of the present invention have shown no significant degradation in performance of an inductor circuit-based, wide-band, two-stage LNA, including the noise figure and the third order output intercept point. The noise figure (NF) is a measure expressed in decibels of degradation of the signal-to-noise ratio (SNR) caused by components in a signal chain, with lower values indicating better performance. The third order output intercept point (OIP3) is a figure of merit commonly used to characterize the linearity of a signal chain. Noise (characterized by NF) limits an amplifier's sensitivity at low input signal amplitudes, while linearity (characterized by OIP3) limits sensitivity at high input amplitudes. Taken together, these two metrics, NF and OIP3, along with the maximum S21 (Gain) parameter, define an amplifier's useful dynamic range for a signal.

In a modeled embodiment of an example LNA of the type shown in FIG. 6, it has been found that the degree of degradation of the NF depends on the mutual coupling factor K while the OIP3 does not significantly depend on the mutual coupling factor K. Accordingly, the degree of degradation of the NF can be controlled by attention to fine circuit details. For example, in one modeled embodiment, the NF degradation was less than about 0.1 dB for $K \leq -0.5$.

Figure 9:
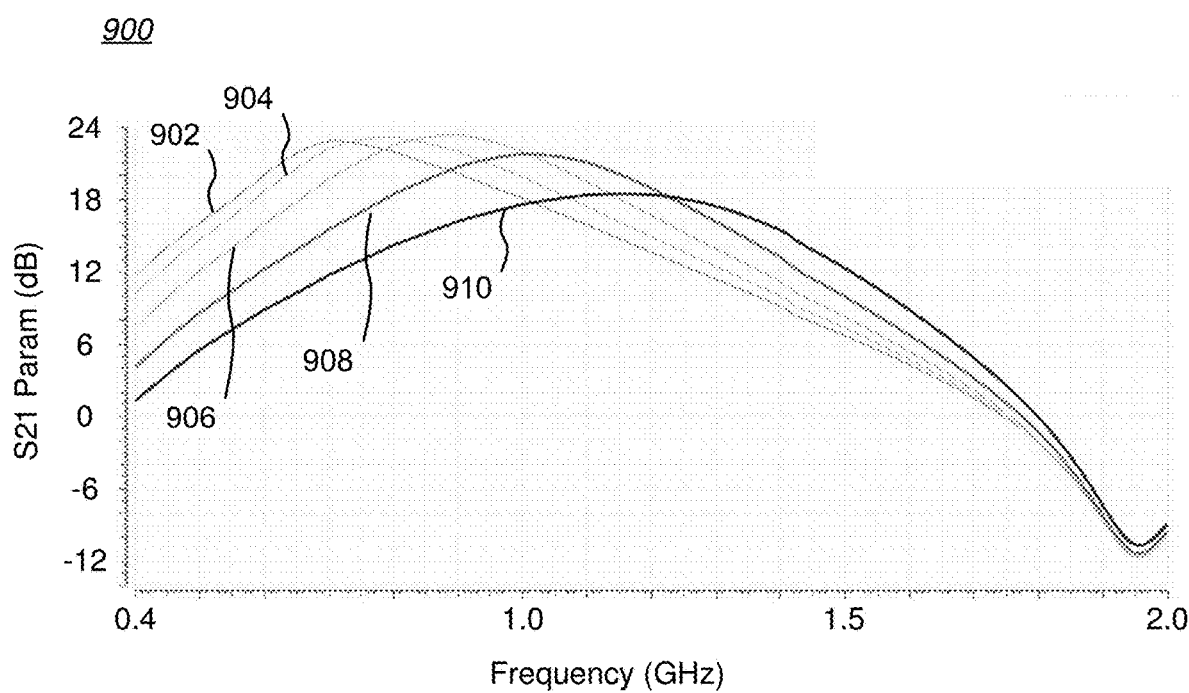
FIG. 9 is a graph of the S21 parameters versus frequency for 5 different example LNAs of the type shown in FIG. 6, varying only the mutual coupling factor K.

Gain bandwidth also depends on the mutual coupling factor K: in general (but depending on the configurations of the first amplifier stage 204 and the second amplifier stage 208), a positive mutual coupling factor K increases the gain bandwidth, while a negative mutual coupling factor K decreases gain bandwidth. For example, FIG. 9 is a graph 900 of the S21 parameters versus frequency for 5 different example LNAs of the type shown in FIG. 6, varying only the mutual coupling factor K. In the illustrated graph 900, graph line 902 corresponds to $K=-0.5$; graph line 904 corresponds to $K=-0.3$; graph line 906 corresponds to $K=0$; graph line 908 corresponds to $K=+0.3$; and graph line 910 corresponds to $K=+0.5$. If a lower mutual coupling factor K is desired to control NF degradation, the lower gain bandwidth can be restored by using a larger total load inductance for the inductors L1, L2 of the inductor circuit 206 and/or by adjusting the selectable-value capacitors C1, C2 and/or adjusting the selectable-value resistors R1, R2.

System Aspects

Embodiments of the present invention are useful in a wide variety of larger radio frequency (RF) circuits and systems in a variety of applications, such as radar systems (including phased array and automotive radar systems), radio systems (including cellular radio systems), and test equipment. Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Figure 10:
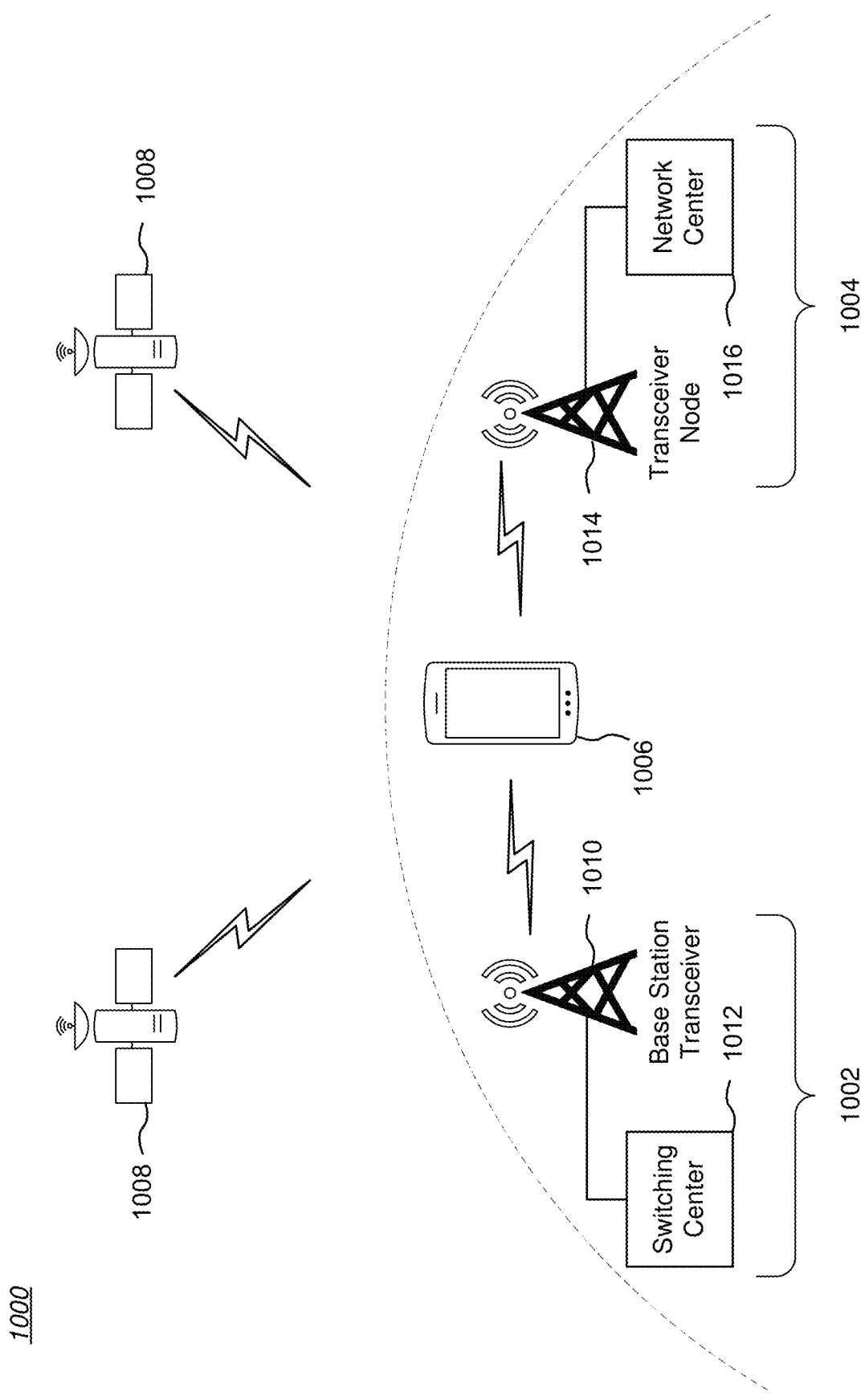
FIG. 10 illustrates an exemplary prior art wireless communication environment comprising different wireless communication systems and may include one or more mobile wireless devices.

As an example of wireless RF system usage, FIG. 10 illustrates an exemplary prior art wireless communication environment 1000 comprising different wireless communication systems 1002 and 1004 and may include one or more mobile wireless devices 1006.

A wireless device 1006 may be capable of communicating with multiple wireless communication systems 1002, 1004 using one or more of the telecommunication protocols noted above. A wireless device 1006 also may be capable of communicating with one or more satellites 1008, such as navigation satellites (e.g., GPS) and/or telecommunication satellites. The wireless device 1006 may be equipped with multiple antennas, externally and/or internally, for operation on different frequencies and/or to provide diversity against deleterious path effects such as fading and multi-path interference. A wireless device 1006 may be a cellular phone, a personal digital assistant (PDA), a wireless-enabled computer or tablet, or some other wireless communication unit or device. A wireless device 1006 may also be referred to as a mobile station, user equipment, an access terminal, or some other terminology.

The wireless system 1002 may be, for example, a CDMA-based system that includes one or more base station transceivers (BSTs) 1010 and at least one switching center (SC) 1012. Each BST 1010 provides over-the-air RF communication for wireless devices 1006 within its coverage area. The SC 1012 couples to one or more BSTs in the wireless system 1002 and provides coordination and control for those BSTs.

The wireless system 1004 may be, for example, a TDMA-based system that includes one or more transceiver nodes 1014 and a network controller (NC) 1016. Each transceiver node 1014 provides over-the-air RF communication for wireless devices 1006 within its coverage area. The NC 1016 couples to one or more transceiver nodes 1014 in the wireless system 1004 and provides coordination and control for those transceiver nodes 1014.

In general, each BST 1010 and transceiver node 1014 is a fixed station that provides communication coverage for wireless devices 1006, and may also be referred to as base stations or some other terminology. The SC 1012 and the RC 1016 are network entities that provide coordination and control for the base stations and may also be referred to by other terminologies.

Figure 11:
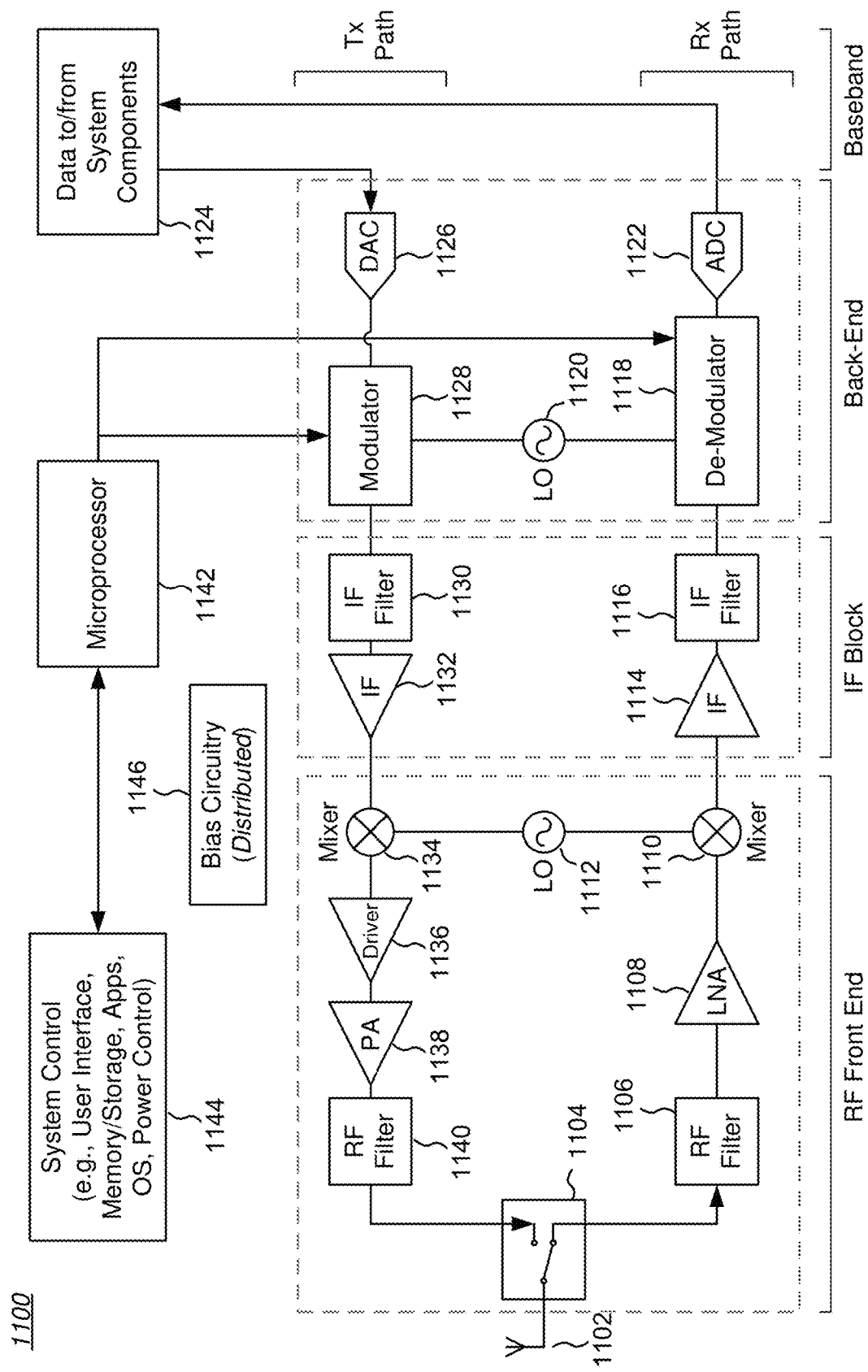
FIG. 11 is a block diagram of a typical prior art transceiver that might be used in a wireless device, such as a cellular telephone.

An important aspect of any wireless system, including the systems shown in FIG. 10, is in the details of how the component elements of the system perform. FIG. 11 is a block diagram of a typical prior art transceiver 1100 that might be used in a wireless device, such as a cellular telephone. As illustrated, the transceiver 1100 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 1102 and a switching unit 1104, which may be implemented with active switching devices (e.g., field effect transistors or FETs), or with passive devices that implement frequency-domain multiplexing, such as a diplexer or duplexer. An RF filter 1106 passes desired received RF signals to a low noise amplifier (LNA) 1108, the output of which is combined in a mixer 1110 with the output of a first local oscillator 1112 to produce an intermediate frequency (IF) signal. The LNA 1108 is preferably of one of the types taught by this disclosure. The IF signal may be amplified by an IF amplifier 1114 and subjected to an IF filter 1116 before being applied to a demodulator 1118, which may be coupled to a second local oscillator 1120. The demodulated output of the demodulator 1118 is transformed to a digital signal by an analog-to-digital converter 1122 and provided to one or more system components 1124 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 1124 is transformed to an analog signal by a digital-to-analog converter 1126, the output of which is applied to a modulator 1128, which also may be coupled to the second local oscillator 1120. The modulated output of the modulator 1128 may be subjected to an IF filter 1130 before being amplified by an IF amplifier 1132. The output of the IF amplifier 1132 is then combined in a mixer 1134 with the output of the first local oscillator 1112 to produce an RF signal. The RF signal may be amplified by a driver 1136, the output of which is applied to a power amplifier (PA) 1138. The amplified RF signal may be coupled to an RF filter 1140, the output of which is coupled to the antenna 1102 through the switching unit 1104.

The operation of the transceiver 1100 is controlled by a microprocessor 1142 in known fashion, which interacts with system control components (e.g., user interfaces, memory/storage devices, application programs, operating system software, power control, etc.). In addition, the transceiver 1100 will generally include other circuitry, such as bias circuitry 1146 (which may be distributed throughout the transceiver 1100 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1100 may be in a positioned in a different order (e.g., filters) or omitted. Other components can be (and usually are) added (e.g., additional filters, impedance matching networks, variable phase shifters/attenuators, power dividers, etc.).

The current invention improves receiver and transceiver products by enabling smaller IC dies embodying a mutually coupled inductor circuit-based, wide-band, two-stage LNA that has wideband coverage while meeting necessary input matching and output matching characteristics. Bandwidth can be tuned by selection of a mutual coupling factor K and/or total inductance of the mutually coupled inductor circuit 206 and/or the relative inductance values of the inductors L1 and L2. As a person of ordinary skill in the art will understand, the system architecture is beneficially impacted by the current invention in critical ways, including wider bandwidth, favorable NF and OIP3, and lower cost. These system-level improvements are specifically enabled by the current invention.

Methods

Figure 12:
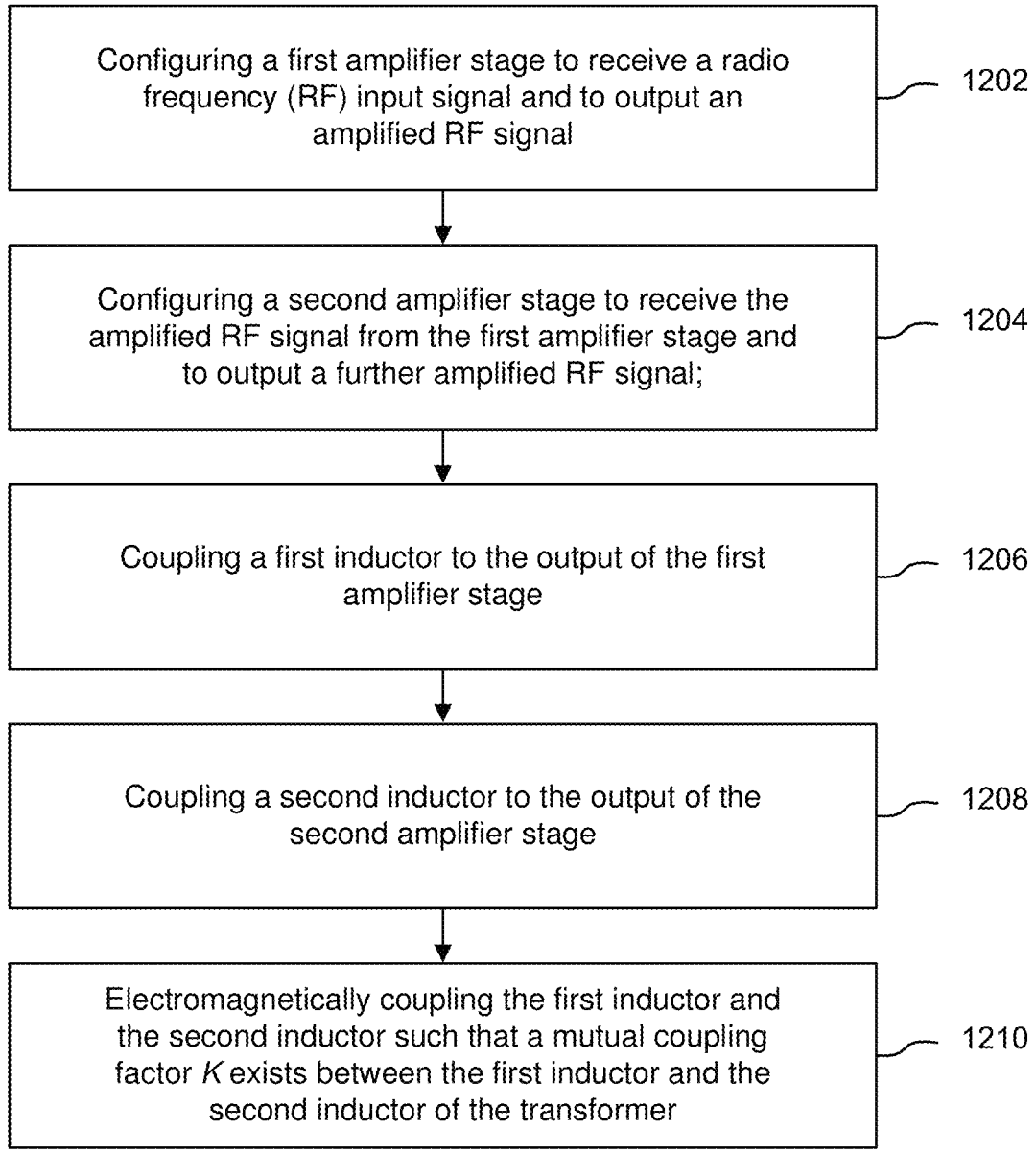
FIG. 12 is a process flow chart showing one method for configuring a low noise amplifier.

Another aspect of the invention includes methods configuring a low noise amplifier. For example, FIG. 12 is a process flow chart 1200 showing one method for configuring a low noise amplifier. The method includes configuring a first amplifier stage to receive a radio frequency (RF) input signal and to output an amplified RF signal [BLOCK 1202]; configuring a second amplifier stage to receive the amplified RF signal from the first amplifier stage and to output a further amplified RF signal [BLOCK 1204]; coupling a first inductor to the output of the first amplifier stage [BLOCK 1206]; coupling a second inductor to the output of the second amplifier stage [BLOCK 1208]; and electromagnetically coupling the first inductor and the second inductor such that a mutual coupling factor K exists between the first inductor and the second inductor of the inductor circuit [BLOCK 1210].

Additional aspects of the above method may include one or more of the following: coupling a matching network between the input of the first amplifier stage and the RF input signal; coupling a tuning capacitor between the output of the first amplifier stage and the input of the second amplifier stage; coupling a tuning capacitor in parallel with a corresponding one of the first inductor and/or the second inductor; coupling a tuning resistor in parallel with a corresponding one of the first inductor and/or the second inductor; coupling one or more degeneration inductors to one or more amplifier stages; coupling an output capacitor to the output of the second amplifier stage; coupling the first amplifier stage and the second amplifier stage in a cascode con-figuration; and/or coupling the first amplifier stage and the second amplifier stage in a common source configuration.

Fabrication Technologies & Options

The FETs of the circuits described with respect to FIGS. 6-8 may be MOSFETs, and are beneficially MOSFETs manufactured by a silicon-on-insulator (SOI) process. The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

As used in the present disclosure, the term "IC" refers to an integrated circuit or monolithic integrated circuit composed of a set of electronic circuits and/or micromechanical structures on one segment of semiconductor material such as silicon. An IC can also be referred to as a "chip", "die", or a "microchip".

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

Conclusion

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An amplifier, including:
   (a) a first amplifier stage having an input configured to receive a radio frequency (RF) input signal, and an output for an amplified RF signal;
   (b) a second amplifier stage having an input configured to receive the amplified RF signal from the first amplifier stage, and an output for a further amplified RF signal;
   (c) a mutually-coupled inductor circuit coupled to the output of the first amplifier stage to the output of the second amplifier stage, and configured to be coupled to at least one supply voltage, the mutually-coupled inductor circuit including:
      (1) a first inductor coupled to the output of the first amplifier; and
      (2) a second inductor coupled to the output of the second amplifier stage;
   wherein a mutual coupling factor K exists between the first inductor and the second inductor of the mutually-coupled inductor circuit.

2. The invention of claim 1, wherein the mutual coupling factor K is equal to or greater than about −0.5 and less than or equal to about +0.5.

3. The invention of claim 1, wherein the absolute value of the mutual coupling factor K is in a range from and including about 0.3 to and including about 0.5.

4. The invention of claim 1, wherein the amplifier comprises a low noise amplifier.

5. The invention of claim 1, wherein the first amplifier stage includes a first input FET and further including a first degeneration inductor coupled between the source of the first input FET and a reference voltage, and wherein the second amplifier stage includes a second input FET and further including a second degeneration inductor coupled between the source of the second input FET and the reference voltage.

6. The invention of claim 1, further including a tuning capacitor coupled between the output of the first amplifier stage and the input of the second amplifier stage.

7. The invention of claim 1, further including a selectable-value capacitor coupled in parallel with a corresponding one of the first inductor and/or the second inductor.

8. The invention of claim 1, further including a selectable-value resistor coupled in parallel with a corresponding one of the first inductor and/or the second inductor.

9. An amplifier, including:
   (a) a first amplifier stage comprising:
      (1) a first field effect transistor (FET) having a gate configured to receive a radio frequency (RF) input signal, a source configured to be coupled to a first degeneration inductor, and a drain; and
      (2) a second FET having a gate configured to receive a first bias voltage, a source coupled to the drain of the first FET, and a drain coupled to a first output node;
   (b) a second amplifier stage comprising:
      (1) a third FET having a gate coupled to the first output node, a source configured to be coupled to a second degeneration inductor, and a drain; and
      (2) a fourth FET having a gate configured to receive a second bias voltage, a source coupled to the drain of the third FET, and a drain coupled to a second output node; and
   (c) a mutually-coupled inductor circuit coupled to the first output node and to the second output node, and configured to be coupled to at least one supply voltage, the mutually-coupled inductor circuit including:
      (1) a first inductor coupled to the output of the first output node; and
      (2) a second inductor coupled to the second output node;
   wherein a mutual coupling factor K exists between the first inductor and the second inductor of the inductor circuit.

10. The invention of claim 9, wherein the mutual coupling factor K is equal to or greater than about −0.5 and less than or equal to about +0.5.

11. The invention of claim 9, wherein the mutual coupling factor K is equal to or greater than about −0.3 and less than or equal to about +0.3.

12. The invention of claim 9, wherein the absolute value of the mutual coupling factor K is in a range from and including about 0.3 to and including about 0.5.

13. The invention of claim 9, further including a tuning capacitor coupled between the first output node and the gate of the third FET.

14. The invention of claim 9, further including a selectable-value capacitor coupled in parallel with a corresponding one of the first inductor and/or the second inductor.

15. The invention of claim 9, further including a selectable-value resistor coupled in parallel with a corresponding one of the first inductor and/or the second inductor.

16. The invention of claim 9, wherein the amplifier comprises a low noise amplifier.

17. The invention of claim 9, further including a first degeneration inductor coupled between the source of the first FET and a reference voltage, and a second degeneration inductor coupled between the source of the third FET and the reference voltage.

18. An amplifier, including:
- (a) a first amplifier stage comprising:
  - (1) a first field effect transistor (FET) having a gate configured to receive a radio frequency (RF) input signal, a source coupled to a first degeneration inductor, and a drain; and
  - (2) a second FET having a gate configured to receive a first bias voltage, a source coupled to the drain of the first FET, and a drain coupled to a first output node;
- (b) a second amplifier stage comprising:
  - (1) a third FET having a gate coupled to the first output node, a source coupled to a second degeneration inductor, and a drain; and
  - (2) a fourth FET having a gate configured to receive a second bias voltage, a source coupled to the drain of the third FET, and a drain coupled to a second output node; and
- (c) a mutually-coupled inductor circuit coupled to the first output node and to the second output node, and configured to be coupled to at least one supply voltage, the mutually-coupled inductor circuit including:
  - (1) a first inductor coupled to the output of the first output node; and
  - (2) a second inductor coupled to the second output node;

wherein a mutual coupling factor K exists between the first inductor and the second inductor of the inductor circuit, and the absolute value of the mutual coupling factor K is in a range from and including about 0.3 to and including about 0.5.

19. The invention of claim 18, wherein the amplifier comprises a low noise amplifier.

20. The invention of claim 18, further including a first degeneration inductor coupled between the source of the first FET and a reference voltage, and a second degeneration inductor coupled between the source of the third FET and the reference voltage.

\* \* \* \* \*